United States Patent [19]
Harvey

[11] Patent Number: 5,418,495
[45] Date of Patent: May 23, 1995

[54] INPUT STAGE IMPROVEMENT FOR CURRENT FEEDBACK AMPLIFIERS

[75] Inventor: Barry Harvey, Los Altos, Calif.

[73] Assignee: Elantec, Milpitas, Calif.

[21] Appl. No.: 245,683

[22] Filed: May 18, 1994

[51] Int. Cl.$^6$ .................... H03F 3/26; H03F 1/14
[52] U.S. Cl. ................................. 330/265; 330/292
[58] Field of Search ............... 330/265, 267, 288, 292, 330/294

[56] References Cited

U.S. PATENT DOCUMENTS

| | | | |
|---|---|---|---|
| 5,179,355 | 1/1993 | Harvey | 330/265 |
| 5,229,721 | 7/1993 | Stade | 330/265 |

*Primary Examiner*—Steven Mottola
*Attorney, Agent, or Firm*—Fliesler, Dubb, Meyer & Lovejoy

[57] ABSTRACT

A current feedback amplifier having circuitry in its input stage for matching the error current created due to a parasitic capacitance ($C_{IN}$) on the negative, or inverting input terminal ($V_{IN-}$). Additional circuitry in the input stage subtracts the matching current from the error current created by $C_{IN}$ to cancel the error current due to $C_{IN}$ and thus eliminate the peaking of gain at high frequencies caused by $C_{IN}$. In addition to cancellation of $C_{IN}$ errors, the subtraction process in the input stage enables cancellation of error current resulting from bias current common mode rejection (ICMR) as well as component dissimilarities created during processing.

7 Claims, 6 Drawing Sheets

INPUT STAGE IMPROVEMENT FOR CURRENT FEEDBACK AMPLIFIERS

BACKGROUND OF THE INVENTION

1. Field of the Invention

This invention relates to current feedback amplifiers. More particularly, this invention relates to circuitry to eliminate the peaking of gain at high frequencies due to parasitic capacitance at the negative, or inverting input terminal of a current feedback amplifier as well as to eliminate bias current variations at the negative input terminal.

2. Description of the Related Art

FIG. 1 shows a conventional current feedback amplifier circuit. The circuitry includes an input stage formed by two complementary buffers including four transistors 101–104 along with two current mirrors 120 and 130. The circuitry further includes an output stage formed by output buffer 140. Feedback for the amplifier is provided by an external feedback resistor $R_F$, while gain is controlled by an external resistor $R_G$ and compensation is provided by capacitor $C_{COMP}$.

In the input stage, a first buffer of the two complementary buffers is provided by a pair of complementary transistors 101 and 102. The bases of transistors 101 and 102 are connected to serve as a positive input terminal $V_{IN+}$ for the amplifier. The collector of transistor 101 is connected to a negative power supply V−, while the collector of transistor 102 is connected to a positive power supply V+. Transistors 101, 102 are biased into conduction by two current sources 106, 108. The first current source 106 is connected between the positive power supply V+ and the emitter of transistor 101. The second current source 108 is connected between the negative power supply V− and the emitter of transistor 102.

The second buffer of the input stage is provided by a second pair of complementary transistors 103 and 104. Transistors 103 and 104 each have a base connected to an emitter of a complementary transistor in the first buffer. The second pair of transistors 103, 104 are connected in an emitter follower configuration with common emitters being connected at a negative, or inverting input terminal $V_{IN-}$.

The current mirrors 120 and 130 of the input stage have inputs $I_{IN}$ connected to respective collectors of the second pair of transistors 103, 104. The outputs $I_{OUT}$ of current mirrors 120, 130 are connected to form a gain node G. Current mirror 120 includes two pnp type transistors 122 and 124 with common bases, while current mirror 130 includes two npn type transistors 132 and 134 with common bases. Transistors 122 and 124 each have emitters connected through an emitter resistor to the positive power supply V+, while transistors 132 and 134 have emitters connected through an emitter resistor to the negative power supply V−. Transistors 122 and 132 each have a base to collector connection. The collectors of transistors 122 and 132 form the input $I_{IN}$ of respective current mirrors 120 and 130. Transistors 124 and 134 have collectors forming the output $I_{OUT}$ of respective current mirrors 120 and 130. Although specific circuitry for current mirrors 120 and 130 is shown, current mirrors 120 and 130 can be made up of other current mirror circuitry known in the art.

The output buffer 140 shown includes four transistors 141–144 connected as a pair of complementary buffers and biased by current sources 146 and 148 similar to the complementary buffers formed by transistors 101–104 as biased by current sources 106 and 108 in the input stage. The output buffer 140 is connected between gain node G and the amplifier output terminal $V_{OUT}$. Although specific circuitry is shown for output buffer 140, other circuitry for output buffer 140 known in the art can be utilized which provides a high impedance at gain node G.

The feedback resistor $R_F$ is connected between the amplifier output terminal $V_{OUT}$ and the negative input terminal $V_{IN-}$ to provide the current feedback for the amplifier. The external resistor $R_G$ connected from the negative input terminal $V_{IN-}$ to ground controls amplifier gain.

$C_{IN}$ is not intentionally connected, but is a parasitic capacitance from $V_{IN-}$ to ground. $C_{IN}$ arises from the parasitic capacitance associated with amplifier construction and the bodies of $R_F$ and $R_G$. Compensation capacitor $C_{COMP}$ is intentionally connected from the high capacitance gain node G to ground to control the gain vs. frequency characteristics of the amplifier.

In operation, the two complementary buffers formed by transistors 101–104 buffer the voltage at the positive input terminal $V_{IN+}$ and present it to the negative input terminal $V_{IN-}$. An error current is provided at the negative input terminal $V_{IN-}$ by resistors $R_F$ and $R_G$ which form a voltage divider feedback circuit to divide the voltage at the amplifier output terminal $V_{OUT}$. The divided voltage is the voltage that would exist at $V_{IN-}$ if $V_{IN-}$ were disconnected from the gain node G, or $V_{OUT}R_G/(R_G+R_F)$.

For a given output voltage at $V_{OUT}$, the error current flows into or out of the feedback circuit through the negative input terminal $V_{IN-}$ when the voltage at $V_{IN-}$ deviates from the divided voltage, $V_{OUT}R_G/(R_G+R_F)$. The error current is shared, or split by the emitters of transistors 103 and 104. The error current passes from the emitters through the collector of transistors 103 and 104. Current mirror 120 mirrors the current flowing in the collector of transistor 103 and sources the mirrored current to gain node G. Current mirror 130 sinks a replica of the current flowing in the collector of transistor 104 from gain node G. Current mirrors 120 and 130, thus, rejoin the error current halves into the gain node G to apply to the input of output buffer 140.

Error current continues to flow until $V_{OUT}=V_{IN-}(R_F+R_G)/R_G$ at which time the error current falls to zero. With no error current flowing into or out of the feedback circuit through node $V_{IN-}$, the collector currents in transistors 103 and 104 are equal and the current sourced by the current mirror 120 equals the current sunk by the current mirror 130. As a result, the net current into the gain node G is zero and the voltage applied to the input of output buffer 140 remains unchanged.

With the feedback divider provided by resistors $R_F$ and $R_G$, the amplifier gain is $V_{OUT}/V_{IN-}$ or $(R_F+R_G)/R_G$. With increasing frequency, capacitances have an increasing effect on gain. Compensation capacitor $C_{COMP}$ is provided to dominate other capacitances in the circuitry to control the amplifier gain characteristics with increasing frequency as shown by curve 202 of FIG. 2. With $C_{COMP}$, gain drops to the 3 dB bandwidth point at $f=1/(2\pi C_{COMP}R_F)$ as shown.

As increased bandwidth is desired, $C_{COMP}$ is reduced toward the value of $C_{IN}$. With $C_{COMP}$ approaching $C_{IN}$, however, $C_{IN}$ begins to affect the amplifier output causing undesirable gain peaking beyond the expected 3 dB bandwidth of $1/(2\pi C_{COMP}R_F)$ as shown by curve 204 in FIG. 2.

It is thus desirable to reduce $C_{IN}$. In practice it has not been possible to reduce $C_{IN}$ below about 1.2 pF with surface mount construction or below about 2.5 pF with DIP and leaded components.

SUMMARY OF THE INVENTION

The present invention enables cancellation of the effects of $C_{IN}$ to provide a more reliable and controllable frequency response.

In addition to cancellation of $C_{IN}$ errors, the present invention enables cancellation of an error quantity generally referred to as bias current common mode rejection (ICMR) as well as bias current error caused by component dissimilarities created during processing.

The present invention is an improvement for the input stage of a current feedback amplifier, such as the current feedback amplifier shown in FIG. 1. A first embodiment of the present invention includes:

- a first pair of emitter follower transistors, similar to transistors 103 and 104 of FIG. 1, having bases coupled to a positive input ($V_{IN+}$) of the amplifier, emitters coupled to the negative input terminal ($V_{IN-}$) of the amplifier which has a parasitic capacitance ($C_{IN}$) and collectors;
- a capacitor ($C^*$) matched to the parasitic capacitance ($C_{IN}$);
- a second pair of emitter follower transistors which are biased to the same quiescent conditions as the first pair of emitter follower transistors, the second pair of emitter follower transistors having bases coupled to the positive input ($V_{IN+}$) of the amplifier, emitters coupled to the capacitor ($C^*$) and collectors; and
- a first pair of current mirrors, each current mirror having an input connected to a collector of one transistor of the first pair of emitter follower transistors and an output connected to the gain node (G);
- a second pair of current mirrors, each current mirror having an input connected to a collector of one transistor of the second pair of emitter follower transistors and an output connected to one transistor of the first pair of emitter follower transistors, each of the second pair of current mirrors subtracting the collector current of the transistor of the second pair from the collector current of the transistor of the first pair; and
- a current source ($I_B$) connected between the inputs of the first pair of current mirrors provided to bias the first set of current mirrors to quiescent conditions at DC, because the current subtraction effect provided by the second pair of current mirrors will eliminate biasing current to the first pair of current mirrors at DC.

A second embodiment of the present invention simplifies the circuitry of the first embodiment by eliminating the second pair of current mirrors. To provide the subtraction function of the second pair of current mirrors in the second embodiment, the collectors of each transistor of the second pair of emitter follower transistors is connected to an output branch of a respective one of the first pair of current mirrors.

BRIEF DESCRIPTION OF THE DRAWINGS

Further details of the present invention are explained with the help of the attached drawings in which.

DETAILED DESCRIPTION

Figure 2:
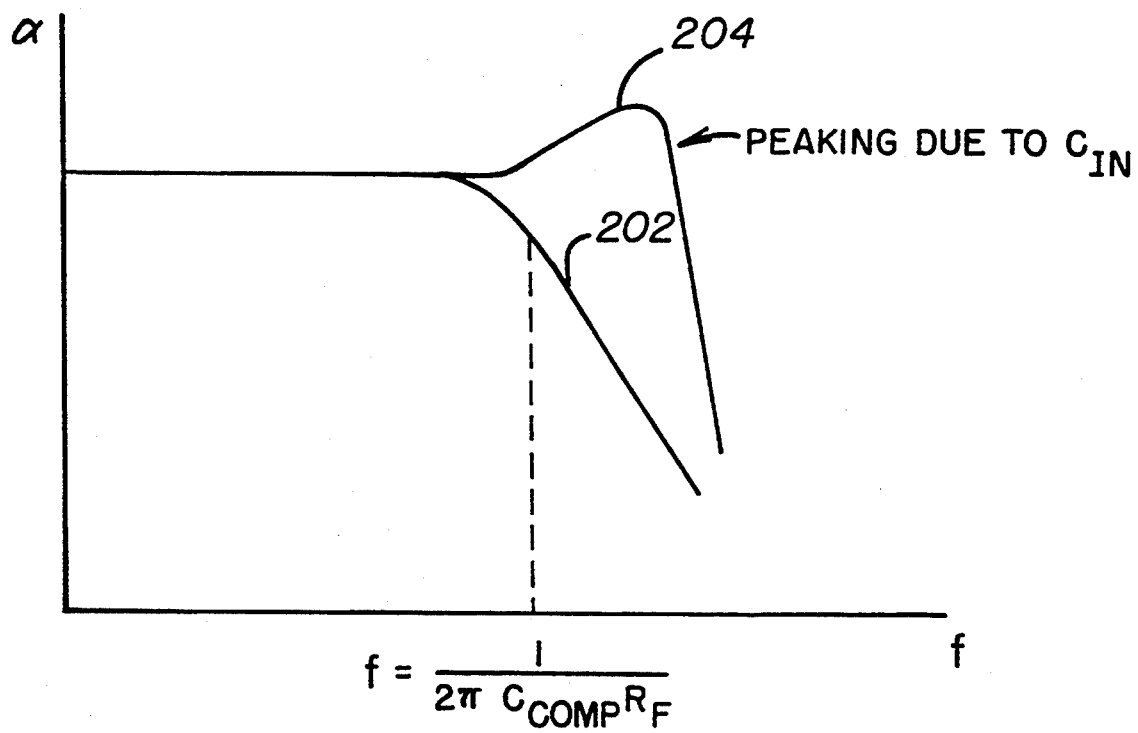
FIG. 2 shows a plot of amplifier gain versus frequency for a typical current feedback amplifier illustrating gain peaking due to $C_{IN}$.
Figure 3:
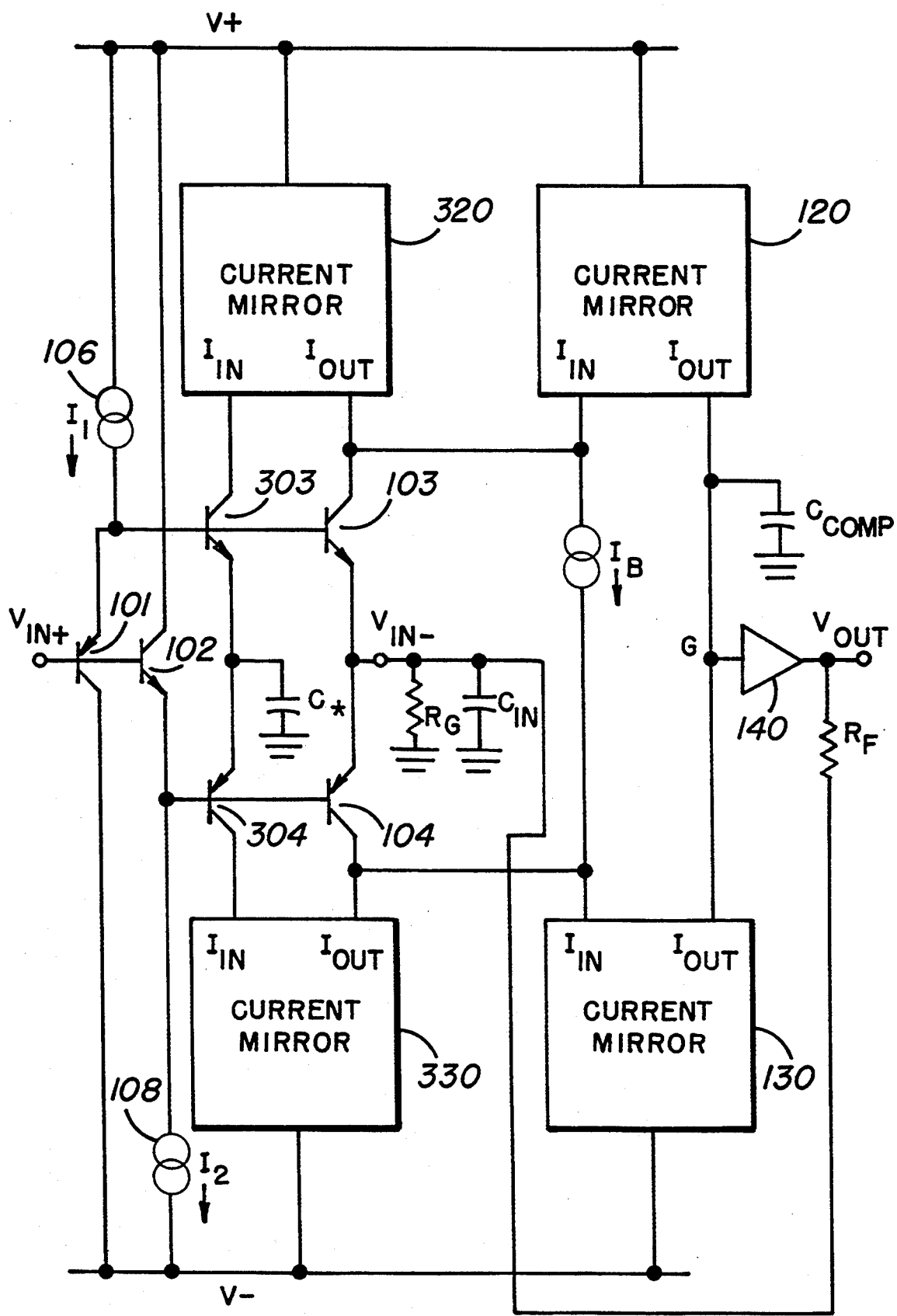
FIG. 3 shows a first embodiment of a current feedback amplifier of the present invention.

FIG. 3 shows a first embodiment of a current feedback amplifier of the present invention. The circuitry of FIG. 3 includes components carried over from FIG. 1 with modifications as described below. For convenience, the circuitry carried over from FIG. 1 to FIG. 3 is similarly labeled.

Figure 1:
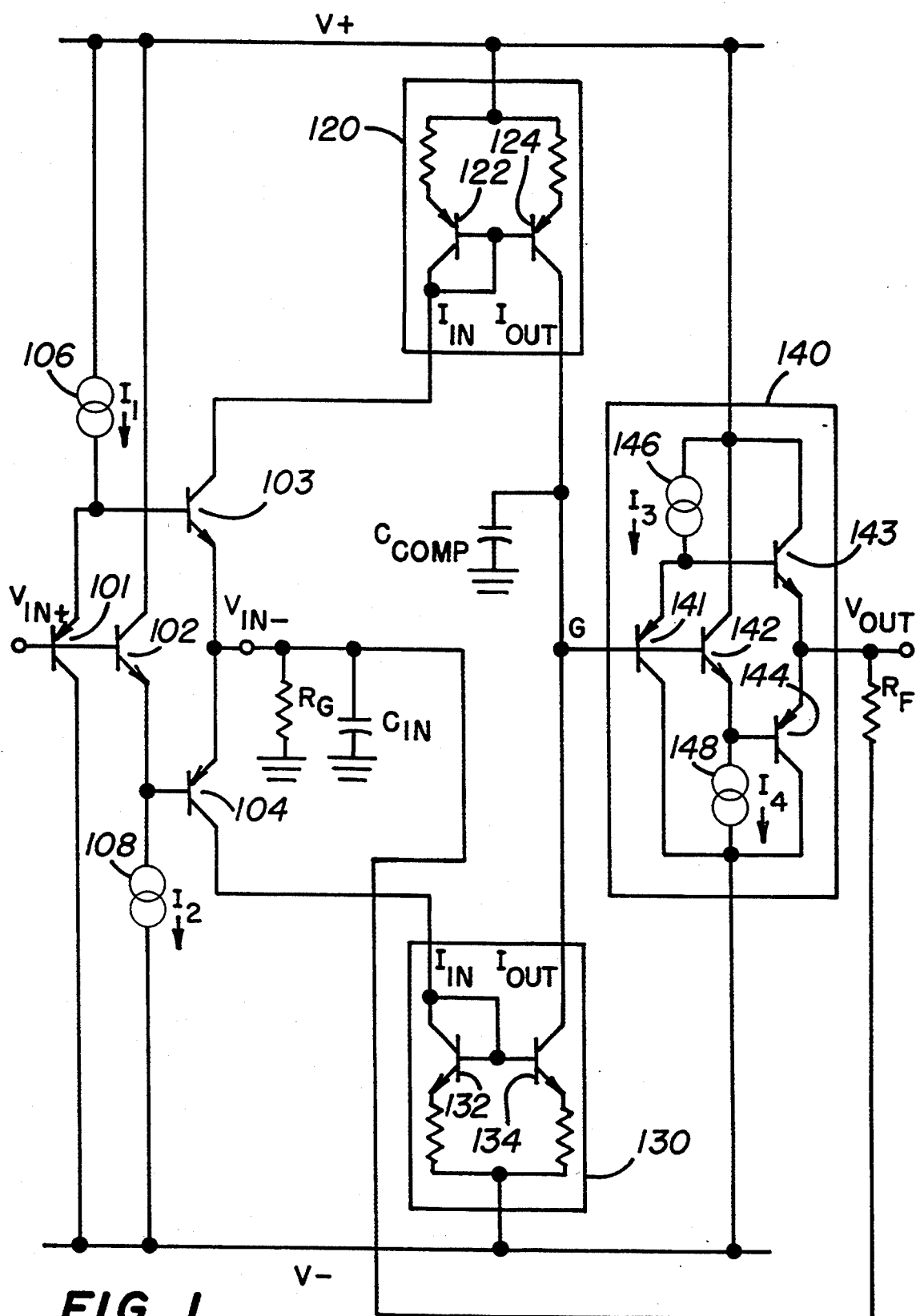
FIG. 1 shows a conventional current feedback amplifier.

Unlike in FIG. 1, in FIG. 3 a pair of complementary transistors 303 and 304 are provided in addition to the complementary transistors 103 and 104 which form the second input buffer. Similar to transistor 103, transistor 303 is an npn type transistor which is complementary to transistor 101 and has a base connected to the emitter of transistor 101. As with transistor 104, transistor 304 is a pnp transistor which is complementary to transistor 102 and has a base connected to the emitter of transistor 102. Unlike transistors 103 and 104 which have emitters connected to the negative input terminal $I_{IN}$, the emitters of transistors 303 and 304 are connected to a newly added capacitor $C^*$.

Also in addition to the circuitry of FIG. 1, FIG. 3 provides a second pair of current mirrors 320 and 330. Current mirrors 320 and 330 have inputs $I_{IN}$ connected to a the collector of a respective one of transistors 303 and 304 and outputs $I_{OUT}$ connected to the collector of one of respective transistors 103 and 104. Circuitry for the current mirrors 320 and 330 can include the circuitry shown for current mirrors 120 and 130 in FIG. 1, or other current mirror circuitry known in the art. Preferably, current mirrors 320 and 330 have a current gain of +1, while current mirrors 120 and 130 may have any practical gain.

Also in addition to the circuitry of FIG. 1, FIG. 3 includes a biasing current source $I_B$ connected between the inputs $I_{IN}$ of current sources 120 and 130.

In operation, the components carried over from FIG. 1 to FIG. 3 operate in the same manner as described previously with performance improvements created by the components which are newly added in FIG. 3 as described below.

Newly added transistors 303 and 304 of FIG. 3 bias at the same quiescent current as transistors 103 and 104, but do not pass feedback error current from the negative input terminal $V_{IN-}$. Instead transistors 303 and 304 now provide current to capacitor $C^*$. $C^*$ is provided to emulate the effects of $C_{IN}$ and can be realized as a physical capacitor, or as a package pin to allow a user to adjust C* to equal $C_{IN}$.

Newly added current mirrors 320 and 330 in conjunction with transistors 303 and 304 and capacitor C* enable cancellation of the effects of $C_{IN}$. Current mirror 320 subtracts the collector current of transistor 303 from the collector current of transistor 103. Similarly, current mirror 330 subtracts the collector current of transistor 304 from the collector current of transistor 104. Since transistors 103 and 104 have collectors carrying error current components determined by $C_{IN}$ and transistors 303 and 304 have collector currents determined by capacitor C* set equal to $C_{IN}$, by subtracting the collector currents of transistor 303 from 103 and 304 from 104, current mirrors 320 and 330 enable cancellation of $C_{IN}$ errors from the signal path.

Newly added current source $I_B$ is required for the circuitry of FIG. 3 to bias current mirrors 120 and 103 to quiescent conditions, particularly at DC. At quiescent conditions, the collector currents of transistors 303 and 103 are equal and the currents of transistors 304 and 104 are equal. By subtracting the currents of transistors 303 from 103 and 304 from 104, current mirrors 320 and 330 can eliminate the quiescent current from the collectors of transistors 103 and 104. Current source $I_B$ is, thus, introduced between the inputs of current mirrors 120 and 130 to enable biasing to quiescent conditions. Due to $I_B$, current mirrors 120 and 130 output a quiescent copy of $I_B$ into the gain node G when the remaining currents into the gain node G are cancelled. Thus, at DC, subsequent stages will bias at a current set by $I_B$.

In addition to elimination of $C_{IN}$ errors, the circuitry of FIG. 3 enables elimination of an error quantity generally referred to as bias current common mode rejection (ICMR). ICMR error is a current offset at the negative input terminal $V_{IN-}$ due to a voltage increase at the positive input terminal $V_{IN+}$. When voltage at the positive input terminal $V_{IN+}$ moves positive, the $\alpha$ of transistor 103 reduces slightly due to the Early effect, and the $\alpha$ of transistor 104 improves. The $\alpha$ variation generates an input related bias current referred to the $V_{IN-}$ input which is the error current quantity referred to as ICMR.

In the circuitry of FIG. 3, the collectors of transistors 303 and 103 carry the same error current due to ICMR and these equal error currents are nearly completely rejected by the subtraction process of current mirror 320. ICMR error currents in transistors 304 and 104 are similarly rejected by current mirror 330.

In addition to elimination of $C_{IN}$ and ICMR errors, the circuitry of FIG. 3 further eliminates current errors due to component dissimilarities created in processing. In fabrication, the sizes of similar npn transistors such as transistors 103 and 303 are generally the same. Additionally, the sizes of similar pnp transistors such as transistors 104 and 304 are generally the same. However, processing variations create dissimilarities between the npn and pnp transistors which cause them to have dissimilar $\alpha$s or $\beta$s. With such dissimilar $\alpha$s or $\beta$s, an equal error current will flow from the collectors of transistors 103 and 303 and from the collectors of transistors 104 and 304. These equal error currents are rejected by the subtraction process of current mirrors 320 or 330.

Figure 4:
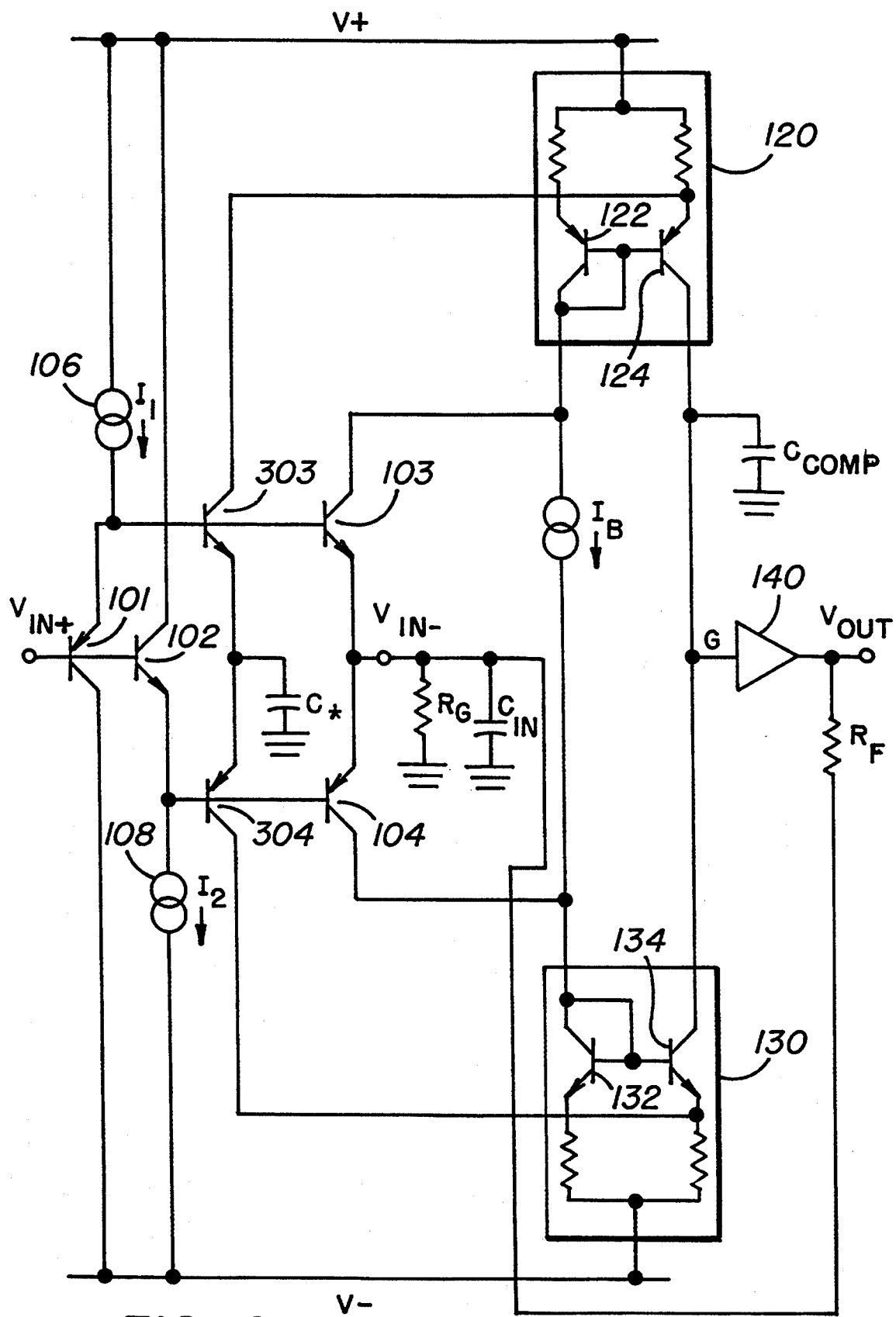
FIG. 4 shows a second embodiment of a current feedback amplifier of the present invention.

FIG. 4 shows a second embodiment of a current feedback amplifier of the present invention. The circuitry of FIG. 4 is a simplified version of FIG. 3 with current mirrors 320 and 330 of FIG. 3 removed and collectors connections of transistors 303 and 304 reconfigured as described below. For convenience, the circuitry carried over from previous figures are similarly labeled.

In FIG. 4, current mirror 120 includes transistors 122 and 124 and current mirror 130 includes transistors 132 and 134 connected in a manner shown in FIG. 1. Unlike the circuitry of FIGS. 1 or 3, in FIG. 4 the collectors of transistors 303 and 304 are connected to the emitters of respective transistors 124 and 134 of current mirrors 120 and 130.

As in FIG. 3, the circuitry of FIG. 4 additionally includes a current source $I_B$ connected between the collectors of the inputs of current mirrors 120 and 130 formed by the respective collectors of transistors 122 and 132.

In operation, as with the circuitry of FIG. 3, components carried over from FIG. 1 to FIG. 4 operate in the same manner as described with respect to FIG. 1 with performance improvements as described below.

Similar to the function provided by current mirrors 320 and 330 of FIG. 3, connection of the collectors of transistors 303 and 304 to the output branch of current mirrors 120 and 130 in FIG. 4 enables cancellation of the effects of $C_{IN}$. Current mirror 120, as connected in FIG. 4 subtracts the collector current of transistor 303 from the collector current of transistor 103. Similarly, current mirror 130, as connected in FIG. 4, subtracts the collector current of transistor 304 from the collector current of transistor 104. Since transistors 103 and 104 have collectors carrying error current components determined by $C_{IN}$ and transistors 303 and 304 have collector currents determined by capacitor C* set equal to $C_{IN}$, by subtracting the collector currents of transistor 303 from 103 and 304 from 104, current mirrors 120 and 130 enable cancellation of $C_{IN}$ errors from the signal path.

As in FIG. 3, current source $I_B$ is required in FIG. 4 to assure current mirrors 120 and 130 are biased to quiescent conditions. Since at quiescent conditions the collector currents of transistors 303 and 103 are equal and the currents of transistors 304 and 104 are equal, by subtracting the currents of transistors 303 from 103 and 304 from 104, current mirrors 120 and 130 will eliminate any current from the collectors of transistors 103 and 104 and will not be able to bias up to a quiescent operating level. Current source $I_B$ is, thus, introduced between the current mirrors 120 and 130 to enabling biasing to quiescent conditions. Due to $I_B$, current mirrors. 120 and 130 output a quiescent copy of $I_B$ into the gain node G. Thus, at quiescent conditions, subsequent stages will bias at a current set by $I_B$.

As with the circuitry of FIG. 3, by cancelling $C_{IN}$ errors by subtraction of the collector currents of transistor 303 from 103 and transistors 304 from 104, the circuitry of FIG. 4 additionally enables elimination of ICMR current error as well as current errors due to component dissimilarities created in processing.

Figure 5:
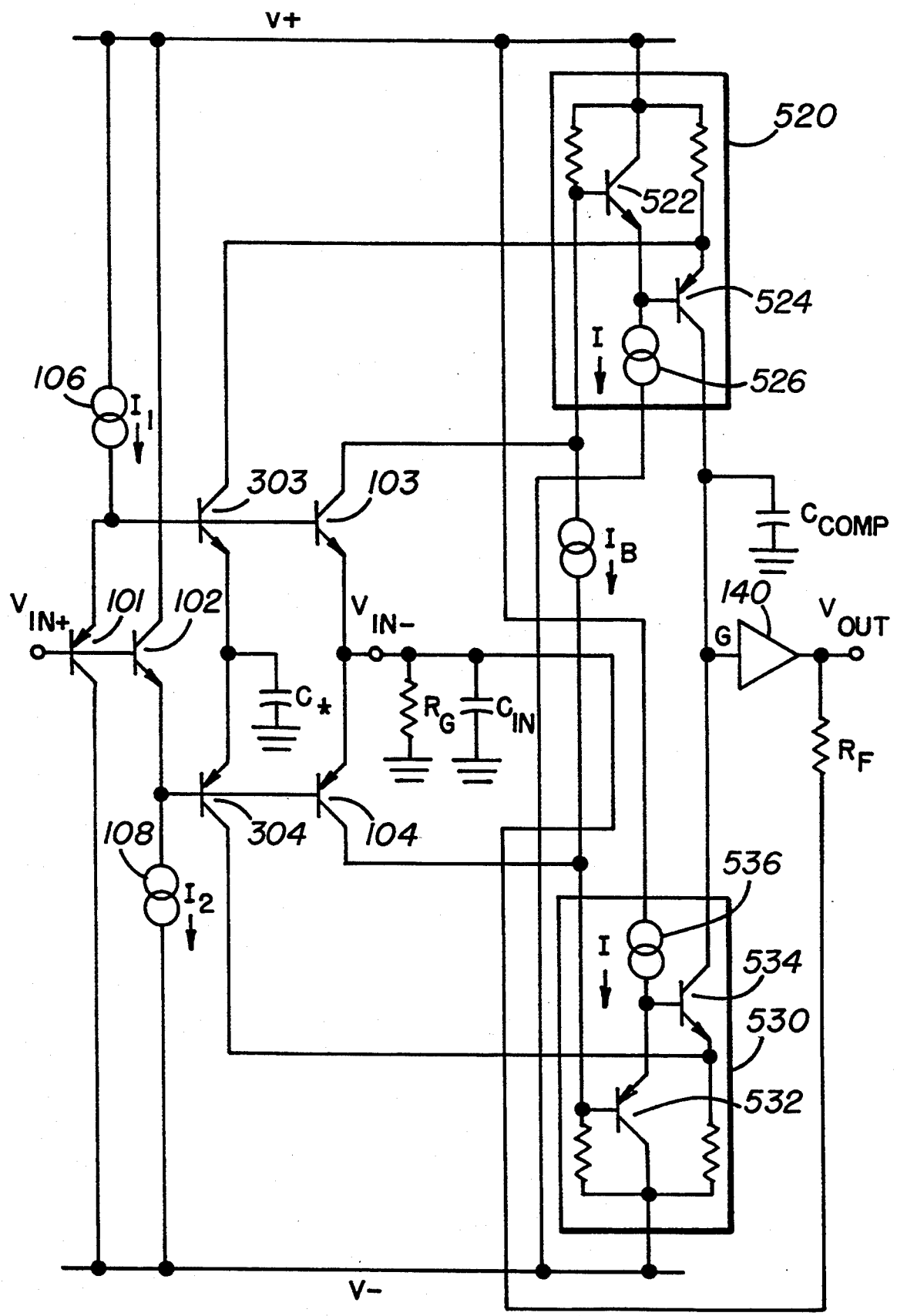
FIG. 5 shows substitution of the current mirror design of FIG. 4 with an alternative current mirror design.

FIG. 5 shows the current feedback amplifier of FIG. 4 with current mirrors 120 and 130 substituted with current mirrors 520 and 530. Current mirrors 520 and 530 enable an increased output impedance and bandwidth from the standard current mirror circuitry shown in FIG. 4. For convenience, the circuitry carried over from previous figures is similarly labeled.

Current mirrors 520 and 530 have inputs connected to the respective collectors of transistors 103 and 104. The inputs of current mirrors 520 and 530 are formed by the bases of respective transistors 522 and 532. The collector of transistor 522 is connected to the positive power supply V+, while its base is connected to V+ through an emitter resistor. The collector of transistor 532 is connected to the negative power supply V−, while its base is connected to V− through an emitter resistor. As in FIG. 4, a current source $I_B$ is connected between the inputs of current mirrors 520 and 530 to assure current mirrors 520 and 530 are biased to quiescent conditions.

Current mirrors 520 and 530 have output branches formed by the collector and emitter of respective transistors 524 and 534. The collectors of transistors 303 and 304 are connected to the emitters of respective transistors 524 and 534. The collectors of transistors 524 and 534 are connected to the gain node. The base of transistor 524 is connected to the emitter of transistor 522 and to a current source 526 connected to V−. The base of transistor 534 is connected to the emitter of transistor 532 and to a current source 536 connected to V+.

In operation, the circuitry of FIG. 5 performs similar to the circuitry of FIG. 4 by cancelling the effects of CIN and eliminating error currents due to ICMR and dissimilarities created during processing.

Figure 6:
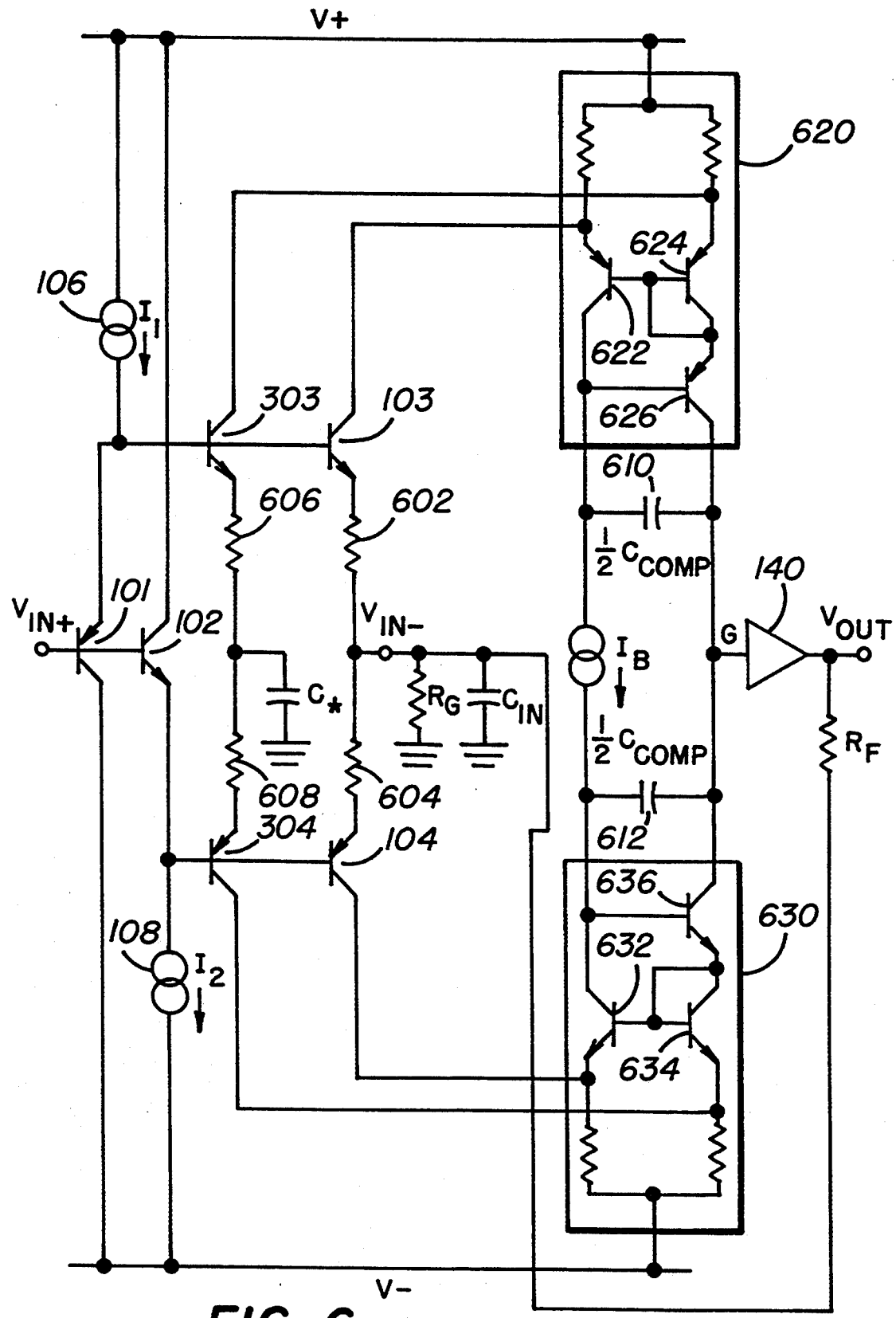
FIG. 6 shows substitution of the current mirror design of FIG. 4 with yet another current mirror design as well as an alternative method of providing compensation.

FIG. 6 shows the current feedback amplifier of FIG. 4 with current mirrors 120 and 130 substituted with current mirrors 620 and 630. FIG. 6 further shows an alternative method of providing compensation from the method shown in FIG. 4. For convenience, the circuitry carried over from previous figures is similarly labeled.

Current mirrors 620 and 630 are Wilson current mirrors which enable an increased output resistance from standard current mirror circuitry shown in FIG. 4. The Wilson current mirrors 620 and 630 each have an input branch formed by the collector and emitter of respective transistors 622 and 632. The collectors of transistors 622 and 632 typically form the input $I_{IN}$ of current mirrors 620 and 630, similar to the collectors of transistors 122 and 132 in FIG. 4. The current source $I_B$ is, thus, connected between the emitters of transistors 622 and 632. The emitters of transistors 103 and 104 are, however, connected to the input branch of current mirrors 620 and 630 at the emitter of respective transistors 622 and 632, such a connection providing advantages as described below. An emitter resistor are provided between the emitter of transistor 622 to the positive power supply V+, while an emitter resistor is provided between the emitter of transistor 632 and the negative power supply V−.

An output branch of the Wilson current mirror 620 is formed by the collectors and emitters of transistors 624 and 626, while the output branch of Wilson current mirror 630 is formed by the collectors and emitters of transistors 634 and 636. The collector of transistor 624 is connected to the emitter of transistor 626, while the collector of transistor 634 is connected to the emitter of transistor 636. Collector to base connections are made on each of transistors 624 and 634. The collectors of transistors 626 and 636 form the output $I_{OUT}$ of current mirrors 620 and 630, similar to the collectors of transistors 124 and 134 in FIG. 4. An emitter resistor is provided between the emitter of transistor 624 to the positive power supply V+, while an emitter resistor is provided between the emitter of transistor 634 and the negative power supply V−.

In FIG. 6, a greater allowable signal span is made possible at the positive input terminal $V_{IN+}$ due to connections of the emitters of transistors 103, 303, 104 and 304 to the current sources 620 and 630. Note that the emitters of transistors 103 and 104 could have been connected to the collectors of respective transistors 622 and 632, but the connection as shown in FIG. 6 enables greater $V_{IN+}$ signal span since the collectors of transistors 103 and 104 are two diode voltages closer to the power supplies. Additionally, emitters of transistors 303 and 304 could have been connected to the collectors of respective transistors 624 and 634, but the connection as shown in FIG. 6 similarly allows a greater $V_{IN+}$ signal span because the collectors of transistors 303 and 304 are one diode voltage closer to the power supplies. Although not shown, standard current mirrors 120 and 130, as shown in FIG. 4, could also be configured to have a greater allowable $V_{IN+}$ signal span. Increased signal span could be obtained by moving the collector connections of transistors 103 and 104 to the emitters of respective transistors 122 and 132.

Alternative circuitry is included in FIG. 6 to provide compensation. Compensation is provided utilizing the Miller effect by substituting the compensation capacitor $C_{COMP}$ in FIG. 4 with two capacitors 610 and 612, each having a value $\frac{1}{2} C_{COMP}$ and each being connected from the gain node G across the respective current mirrors 620 and 630 to a collector of a respective transistor 622 and 632.

In operation, the circuitry of FIG. 6 performs similar to the circuitry of FIG. 4 by cancelling the effects of CIN and eliminating error currents due to ICMR and dissimilarities created during processing. Further, as discussed above, improvements in FIG. 6 enable a higher current mirror output resistance, a greater allowable $V_{IN+}$ signal span and an alternative method of providing compensation.

Although not shown, the circuitry of FIG. 6 may be further modified to include components such as those described in U.S. Pat. No. 5,179,355 entitled "Slew Control In Current Feedback Amplifiers", incorporated herein by reference. Resistive elements may also be utilized to couple the emitters of transistors 103 and 104 to $V_{IN-}$, or to couple the emitters of transistors 303 and 304 to C*. FIG. 6 as well as previous figures may also be modified to include further components as known in the art.

Although the invention has been described above with particularity, this was merely to teach one of ordinary skill in the art how to make and use the invention. Many modifications will fall within the scope of the invention, as that scope is defined by the claims which follow.

What is claimed is:

1. An input stage for a current feedback amplifier having a positive input terminal ($V_{IN+}$), a negative input terminal ($V_{IN-}$) with a parasitic capacitance ($C_{IN}$) and a gain node (G) connected to an output buffer, the input stage comprising:

a first pair of emitter follower transistors having bases coupled to the positive input ($V_{IN+}$), emitters coupled to the negative input ($V_{IN-}$) and collectors;

a capacitor (C*);

a second pair of emitter follower transistors having bases coupled to the positive input ($V_{IN+}$), emitters coupled to the capacitor (C*) and collectors;

a first pair of current mirrors, each current mirror having an input connected to the collector of one transistor of the first pair of emitter follower transistors and an output connected to the gain node (G);

a second pair of current mirrors, each current mirror having an input connected to the collector of one transistor of the second pair of emitter follower transistors and an output connected to the collector of one transistor of the first pair of emitter follower transistors; and a current source ($I_B$) connected between the inputs of the first pair of current mirrors.

2. An input stage for a current feedback amplifier having a positive input terminal ($V_{IN+}$), a negative input terminal ($V_{IN-}$) with a parasitic capacitance ($C_{IN}$) and a gain node (G) connected to an output buffer, the input stage comprising:

a first pair of emitter follower transistors having bases coupled to the positive input ($V_{IN+}$), emitters coupled to the negative input ($V_{IN-}$) and collectors;

a capacitor (C*);

a second pair of emitter follower transistors having bases coupled to the positive input ($V_{IN+}$), emitters coupled to the capacitor (C*) and collectors;

a pair of current mirrors, each current mirror having an input branch connected to the collector of one transistor of the first pair of emitter follower transistors and an output branch connected to the gain node (G) and the collector of one transistor of the second pair of emitter follower transistors; and a current source ($I_B$) connected between the input branches of the pair of current mirrors.

3. The input stage of claim 2, wherein the pair of current mirrors are Wilson current mirrors comprising:

a first transistor having an emitter connected through an emitter resistor to a power supply, a collector and a base a second transistor having an emitter connected through an emitter resistor to a power supply, a base connected to the base of the first transistor, and a collector connected to its base; and a third transistor having a base connected to the collector of the first transistor, an emitter connected to the collector of the second transistor, and a collector, wherein the collector and emitter of the first transistor form the input branch with the one transistor of the first pair of emitter follower transistors connected to the emitter of the first transistor and the current source ($I_B$) connected to the collector of the first transistor, and wherein the collector and emitter of the second transistor and the collector and emitter of the third transistor form the output branch and the one transistor of the second pair of emitter follower transistors is connected to the emitter of the second transistor and the collector of the third transistor is connected to the gain node (G).

4. The input stage of claim 2 wherein the bases of the first and second pair of emitter follower transistors are coupled to the positive input ($V_{IN+}$) of the amplifier by an input buffer comprising:

a pair of complementary transistors, each complementary transistor having a base connected to form the positive input ($V_{IN+}$), an emitter connected to the base of a complementary transistor in the first and second pair of emitter follower transistors and a collector connected to a power supply; and a pair of current sources, each current source connected to an emitter of one of the transistors of the pair of complementary transistors.

5. The input stage of claim 2 further comprising:

a pair of compensation capacitors, each compensation capacitor connected from the gain node (G) to an input branch of one of the pair of current mirrors.

6. An current feedback amplifier having a positive input terminal ($V_{IN+}$), a negative input terminal ($V_{IN-}$) with a parasitic capacitance ($C_{IN}$) and an output terminal ($V_{OUT}$), the current feedback amplifier comprising:

a first pair of complementary transistors, each complementary transistor having a base connected to the positive input ($V_{IN+}$), a collector connected to a power supply and an emitter;

a pair of current sources, each current source connected to the emitter of one of the transistors of the first pair of complementary transistors;

a first pair of emitter follower transistors, each emitter follower transistor having a base connected to the emitter of a complementary transistor in the first pair of complementary transistors, an emitter connected to form the negative input ($V_{IN-}$), and a collector;

a capacitor (C*) having a value matched to the parasitic capacitance ($C_{IN}$), a first end connected to AC ground and a second end;

a second pair of emitter follower transistors, each emitter follower transistor having a base connected to the emitter of a complementary transistor in the first pair of complementary transistors, an emitter connected to the second end of the capacitor (C*) and a collector;

a first pair of current mirrors, each current mirror having an input connected to the collector of one transistor of the first pair of emitter follower transistors and an output connected to the gain node (G);

a second pair of current mirrors, each current mirror having an input connected to the collector of one transistor of the second pair of emitter follower transistors and an output connected to the collector of one transistor of the first pair of emitter follower transistors;

a current source ($I_B$) connected between the inputs of the first pair of current mirrors;

an output buffer having an input connected to the gain node (G) and an output forming the output terminal ($V_{OUT}$);

a feedback circuit comprising a feedback resistor ($R_F$) connected from the output terminal ($V_{OUT}$) to the negative input terminal ($V_{IN-}$) and a second resistor ($R_G$) connected from the negative input terminal ($V_{IN-}$) to a reference potential; and a pair of compensation capacitors, each compensation capacitor connected from the gain node (G) to an input of one of the first pair of current mirrors.

7. An current feedback amplifier having a positive input terminal ($V_{IN+}$), a negative input terminal ($V_{IN-}$) with a parasitic capacitance ($C_{IN}$) and an output terminal ($V_{OUT}$), the current feedback amplifier comprising:

a first pair of complementary transistors, each complementary transistor having a base connected to the positive input ($V_{IN+}$), a collector connected to a power supply and an emitter;

a pair of current sources, each current source connected to the emitter of one of the transistors of the first pair of complementary transistors;

a first pair of emitter follower transistors, each emitter follower transistor having a base connected to the emitter of a complementary transistor in the first pair of complementary transistors, an emitter connected to form the negative input ($V_{IN-}$), and a collector;

a capacitor ($C^*$) having a value matched to the parasitic capacitance ($C_{IN}$), a first end connected to AC ground and a second end;

a second pair of emitter follower transistors, each emitter follower transistor having a base connected to the emitter of a complementary transistor in the first pair of complementary transistors, an emitter connected to the second end of the capacitor ($C^*$) and a collector; a first pair of current mirrors, each current mirror having an input connected to a collector of one transistor of the first pair of emitter follower transistors and an output connected to a gain node (G);

a pair of current mirrors, each current mirror having an input branch connected to the collector of one transistor of the first pair of emitter follower transistors and an output branch connected at one point to the gain node (G) and at a second point, at least one diode from the first point, to the collector of one transistor of the second pair of emitter follower transistors; and a current source ($I_B$) connected between the input branches of the pair of current mirrors;

an output buffer having an input connected to the gain node (G) and an output forming the output terminal ($V_{OUT}$);

a feedback circuit comprising a feedback resistor ($R_F$) connected from the output terminal ($V_{OUT}$) to the negative input terminal ($V_{IN-}$) and a second resistor ($R_G$) connected from the negative input terminal ($V_{IN-}$) to a reference potential; and a pair of compensation capacitors, each compensation capacitor connected from the gain node (G) to an input of one of the first pair of current mirrors.

* * * * *